(12) United States Patent
Katti et al.

(10) Patent No.: US 9,741,644 B2
(45) Date of Patent: Aug. 22, 2017

(54) STACKING ARRANGEMENT FOR INTEGRATION OF MULTIPLE INTEGRATED CIRCUITS

(71) Applicant: Honeywell International Inc., Morristown, NJ (US)

(72) Inventors: Romney R. Katti, Shorewood, MN (US); James L. Tucker, Clearwater, FL (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/703,734

(22) Filed: May 4, 2015

(65) Prior Publication Data

US 2016/0329271 A1 Nov. 10, 2016

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4825* (2013.01); *H01L 21/4871* (2013.01); *H01L 23/4952* (2013.01); *H01L 23/49503* (2013.01); *H01L 23/49541* (2013.01); *H01L 23/49568* (2013.01); *H01L 23/552* (2013.01); *H01L 24/92* (2013.01); *H01L 25/0652* (2013.01);
(Continued)

(58) Field of Classification Search
CPC ........... H01L 23/4952; H01L 23/49575; H01L 24/05; H01L 24/06
See application file for complete search history.

(56) References Cited

U.S. PATENT DOCUMENTS 4,437,718 A 3/1984 Selinko
4,959,706 A 9/1990 Cusack et al.
(Continued)

FOREIGN PATENT DOCUMENTS

JP 57031166 A 2/1982
JP 2002373968 A 12/2002
KR 1020090093398 A 9/2009

OTHER PUBLICATIONS

Salerno, "Multi-Chip Modules & Stacked Die Assemblies," Palomar Technologies Blog, Apr. 30, 2013, 14 pp.
(Continued)

*Primary Examiner* — Matthew Landau
*Assistant Examiner* — Krista Soderholm
(74) *Attorney, Agent, or Firm* — Shumaker & Sieffert, P.A.

(57) ABSTRACT

A stacked integrated circuit (IC) system including a substrate, a contour support, and a first and second IC dies. The contour support including a first support frame attached to the substrate defining a first lateral contact surface substantially orthogonal to the substrate, a support plate on the first support frame substantially parallel to the substrate, and a second support frame on the support plate defining a second lateral contact surface substantially orthogonal to the substrate, with the first and second lateral contact surfaces laterally offset from each other. The first integrated circuit die with a side abutting the first lateral contact surface, the second integrated circuit die with a side abutting the second lateral contact surface such that at least a portion of the support plate is between the first and second integrated circuit dies.

19 Claims, 9 Drawing Sheets

(51) Int. Cl.
*H01L 25/065* (2006.01)
*H01L 25/00* (2006.01)
*H01L 23/552* (2006.01)
*H01L 23/00* (2006.01)

(52) U.S. Cl.
CPC .......... *H01L 25/0657* (2013.01); *H01L 25/50* (2013.01); *H01L 24/05* (2013.01); *H01L 24/06* (2013.01); *H01L 24/13* (2013.01); *H01L 24/16* (2013.01); *H01L 24/29* (2013.01); *H01L 24/32* (2013.01); *H01L 24/33* (2013.01); *H01L 24/45* (2013.01); *H01L 24/48* (2013.01); *H01L 24/80* (2013.01); *H01L 24/81* (2013.01); *H01L 24/83* (2013.01); *H01L 2224/04* (2013.01); *H01L 2224/04042* (2013.01); *H01L 2224/05647* (2013.01); *H01L 2224/06135* (2013.01); *H01L 2224/131* (2013.01); *H01L 2224/16227* (2013.01); *H01L 2224/291* (2013.01); *H01L 2224/2919* (2013.01); *H01L 2224/32225* (2013.01); *H01L 2224/33181* (2013.01); *H01L 2224/45124* (2013.01); *H01L 2224/45144* (2013.01); *H01L 2224/45147* (2013.01); *H01L 2224/48091* (2013.01); *H01L 2224/48145* (2013.01); *H01L 2224/48227* (2013.01); *H01L 2224/48464* (2013.01); *H01L 2224/48465* (2013.01); *H01L 2224/48471* (2013.01); *H01L 2224/48472* (2013.01); *H01L 2224/49109* (2013.01); *H01L 2224/73215* (2013.01); *H01L 2224/73265* (2013.01); *H01L 2224/80203* (2013.01); *H01L 2224/80447* (2013.01); *H01L 2224/80895* (2013.01); *H01L 2224/80896* (2013.01); *H01L 2224/8148* (2013.01); *H01L 2224/81424* (2013.01); *H01L 2224/81439* (2013.01); *H01L 2224/81444* (2013.01); *H01L 2224/81447* (2013.01); *H01L 2224/81484* (2013.01); *H01L 2224/81801* (2013.01); *H01L 2224/83801* (2013.01); *H01L 2224/8548* (2013.01); *H01L 2224/85424* (2013.01); *H01L 2224/85439* (2013.01); *H01L 2224/85447* (2013.01); *H01L 2224/85484* (2013.01); *H01L 2224/9222* (2013.01); *H01L 2224/92165* (2013.01); *H01L 2224/92247* (2013.01); *H01L 2225/0651* (2013.01); *H01L 2225/06506* (2013.01); *H01L 2225/06537* (2013.01); *H01L 2225/06562* (2013.01); *H01L 2225/06575* (2013.01); *H01L 2225/06589* (2013.01); *H01L 2225/06593* (2013.01); *H01L 2924/14* (2013.01); *H01L 2924/1434* (2013.01); *H01L 2924/1435* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(56) References Cited

U.S. PATENT DOCUMENTS

| | | | |
|---|---|---|---|
| 5,008,734 A | 4/1991 | Dutta et al. | |
| 5,235,209 A | 8/1993 | Shimizu et al. | |
| 5,235,211 A | 8/1993 | Hamburgen | |
| 5,241,450 A | 8/1993 | Bernhardt et al. | |
| 5,399,898 A | 3/1995 | Rostoker | |
| 5,468,999 A | 11/1995 | Lin et al. | |
| 5,490,324 A | 2/1996 | Newman | |
| 5,497,027 A | 3/1996 | Crafts | |
| 5,557,502 A | 9/1996 | Banerjee et al. | |
| 5,579,207 A | 11/1996 | Hayden et al. | |
| 5,608,261 A | 3/1997 | Bhattacharyya et al. | |
| 5,689,091 A | 11/1997 | Hamzehdoost et al. | |
| 5,787,575 A | 8/1998 | Banerjee et al. | |
| 5,796,170 A | 8/1998 | Marcantonio | |
| 6,020,629 A | 2/2000 | Farnworth et al. | |
| 6,440,770 B1 | 8/2002 | Banerjee et al. | |
| 6,476,506 B1 | 11/2002 | O'Connor et al. | |
| 6,603,199 B1 | 8/2003 | Poddar | |
| 6,621,155 B1 | 9/2003 | Perino et al. | |
| 6,674,159 B1 | 1/2004 | Peterson et al. | |
| 7,259,450 B2 | 8/2007 | Wood et al. | |
| 7,859,119 B1* | 12/2010 | St. Amand | H01L 25/0657 257/685 |
| 7,875,974 B2* | 1/2011 | Gokan | G11C 5/02 257/723 |
| 7,923,846 B2 | 4/2011 | Do et al. | |
| 7,977,579 B2 | 7/2011 | Bathan et al. | |
| 8,034,713 B2 | 10/2011 | Dunne | |
| 8,084,849 B2 | 12/2011 | Chow et al. | |
| 8,115,293 B2 | 2/2012 | Moon et al. | |
| 8,354,743 B2 | 1/2013 | Jensen et al. | |
| 8,362,607 B2 | 1/2013 | Scheid et al. | |
| 8,552,546 B2* | 10/2013 | Song | H01L 23/16 257/686 |
| 8,778,734 B2 | 7/2014 | Metsis | |
| 8,796,132 B2 | 8/2014 | Sung et al. | |
| 2002/0096767 A1 | 7/2002 | Cote et al. | |
| 2005/0230802 A1* | 10/2005 | Vindasius | H01L 21/563 257/686 |
| 2007/0287227 A1 | 12/2007 | Huddleston et al. | |
| 2008/0197471 A1 | 8/2008 | Suzuki et al. | |
| 2011/0037157 A1 | 2/2011 | Shin et al. | |
| 2012/0149151 A1 | 6/2012 | Tane et al. | |
| 2012/0313647 A1 | 12/2012 | Carpenter et al. | |
| 2013/0221500 A1 | 8/2013 | Zhao et al. | |

OTHER PUBLICATIONS

"Multi-Chip Module Technology (MCM)," International Sensor Systems Inc., retrieved from http://www.internationalsensor.com/manufacturing/mcm on Feb. 23, 2015, 5 pp.

"Multi-Chip Packages (MCPs) / System in a Package," Microsemi, retrieved from http://www.microsemi.com/products/memory/multi-chip-packages-mcps?gclid=COHLp7nX-MMCFVFgfgodYb0AvA on Feb. 23, 2015, 2 pp.

Extended European Search Report from counterpart European Application No. 16166286.1, dated Oct. 17, 2016, 6 pp.

Communication pursuant to Article 94(3) EPC from counterpart European Application No. 16166286.1, dated Mar. 16, 2017, 5 pp.

Response to Article 94(3) EPC Communication dated Mar. 16, 2017, from counterpart European Application No. 6166286.1, filed on Jun. 13, 2017, 14 pp.

* cited by examiner

STACKING ARRANGEMENT FOR INTEGRATION OF MULTIPLE INTEGRATED CIRCUITS

TECHNICAL FIELD

This disclosure relates to a stacking arrangement for multiple integrated circuits within a system.

BACKGROUND

Three-dimensional integrated circuits are employed in applications in which space is an important design factor. As the demand for more functionality in less space increases, so does the demand for three-dimensional packaging. In addition to the benefit of reducing space, these designs may also realize higher speeds because interconnects between circuit components may be shorter.

SUMMARY

In some examples, the disclosure describes a stacked integrated circuit system that includes a substrate defining a substrate major surface; a contour support including: a first support frame attached to the substrate major surface and defining a plurality of first lateral contact surfaces substantially orthogonal to the substrate major surface; a second support frame defining a plurality of second lateral contact surfaces substantially orthogonal to the substrate major surface, where the second support frame is on the first support frame and the second support frame is from the substrate major surface than the first support frame; a first plurality of integrated circuit dies attached to the substrate major surface, where each respective integrated circuit die of the first plurality of integrated circuit dies defines a first die major surface substantially parallel to the substrate major surface and has at least one side that abuts at least one lateral contact surface of the plurality of first lateral contact surfaces; and a second plurality of integrated circuit dies, where each respective integrated circuit die of the second plurality of integrated circuit dies defines a second die major surface substantially parallel to the substrate major surface and has at least one side that abuts at least one lateral contact surface of the plurality of second lateral contact surfaces, and for each integrated circuit die of the first plurality of integrated circuit dies, at least a portion of the integrated circuit die lies between the substrate major surface and an integrated circuit die of the second plurality of integrated circuit dies.

In another example, the disclosure describes a stacked integrated circuit system that includes a substrate defining a substrate major surface; a contour support including a first support frame attached to the substrate major surface and defining a plurality of first lateral contact surfaces substantially orthogonal to the substrate major surface, a second support frame defining a plurality of second lateral contact surfaces substantially orthogonal to the substrate major surface, with the second support frame on the first support frame and the second support frame is farther from the substrate major surface than the first support frame; a first plurality of integrated circuit dies attached to the substrate major surface, where each respective integrated circuit die of the first plurality of integrated circuit dies defines a first die major surface substantially parallel to the substrate major surface and has at least one side that abuts at least one lateral contact surface of the plurality of first lateral contact surfaces; and a second plurality of integrated circuit dies, where each respective integrated circuit die of the second plurality of integrated circuit dies defines a second die major surface substantially parallel to the substrate major surface and has at least one side that abuts at least one lateral contact surface of the plurality of second lateral contact surfaces, and for each integrated circuit die of the first plurality of integrated circuit dies, at least a portion of the integrated circuit die lies between the substrate major surface and an integrated circuit die of the second plurality of integrated circuit dies.

In another example, the discloser describes a method that includes forming a contour support having a first support frame having a first lateral contact surface, a support plate having a support plate major surface, where the first support frame is attached to the support plate major surface with the first lateral contact surface substantially orthogonal to the support plate major surface, and a second support frame having a second lateral contact surface, where the second support frame is attached to the support plate on a side opposite to the support plate major surface with the second lateral contact surface substantially orthogonal to the support plate major surface and the second lateral contact surface is set back from the first lateral contact surface measured in a lateral direction substantially parallel to the support plate major surface. The method also including attaching the first support frame to a major surface of a substrate, attaching a first integrated circuit die to the major surface of the substrate such that a side of the first integrated circuit die abuts the first lateral contact surface, and attaching a second integrated circuit die to the support plate, where a side of the second integrated circuit die abuts the second lateral contact surface and a portion of the support plate is between at least a portion of the first integrated circuit die and at least a portion of second integrated circuit die.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure generally describes an integrated circuit package that includes a contour support that facilitates a dense stacking arrangement of multiple IC dies. In some integrated circuit (IC) systems, IC dies may be vertically stacked in order to increase the density or number of IC dies contained in the system. When IC dies are stacked, electrical connections that extend vertically may be used to supply electrical signals, including power, ground, input/output (I/O), and the like to each IC die in the stack. Additionally, in some examples, IC dies may generate heat, be sensitive to electromagnet (EM) fields (e.g., memory dies), or be sensitive to mechanical shocks and vibration. In some applications, a method for stacking integrated circuits of substantially the same size may be important, for example, creating a memory module of multiple memory dies in a relatively small space to increase the data storage capacity in a system. Such stacked IC systems may be useful as portable storage devices and/or solid state recorders.

A contour support as described herein may include at least two support frames. The support frames may be substantially planar, each including a respective major surface that is substantially parallel to a major surface of a substrate to which the contour support is attached. Each of the support frames also may define at least one lateral contact surface that is oriented substantially orthogonal (e.g., orthogonal or nearly orthogonal) to the substrate major surface. The support frames may be stacked in a direction orthogonal to the substrate major surface. The lateral contact surfaces may be configured to contact a side of a respective IC die, and may be offset from each other in a direction parallel to the substrate major surface. In this way, the contour support may define a lateral offset of the IC dies in the stacked IC arrangement with a star-step like configuration.

In some examples, the contour support also may include at least one support plate that is substantially planar in shape and extends parallel to the substrate major surface. A portion of the support plate may be between a first IC die and a second IC die in the direction orthogonal to the substrate major surface. The support plate may perform one or more functions, including, for example, mechanical support, EM shielding, heat sinking, electrical interconnection between IC dies, or the like. In some examples, the contour support may include multiple support plates, each respective support plate being between two respective IC dies. In some examples, the support plates may form a multitier, comb-like pattern with the IC dies. At least some of the IC dies may be attached to a corresponding support plate to create the sacked IC system.

Figure 1A:
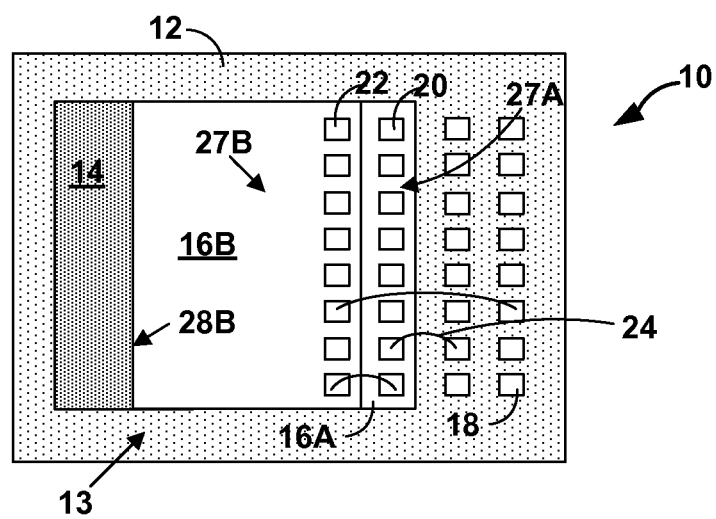
FIG. 1A is a conceptual and schematic diagram illustrating a top view of an example stacked integrated circuit (IC) system including two IC dies stacked in a laterally offset pattern.
Figure 1B:
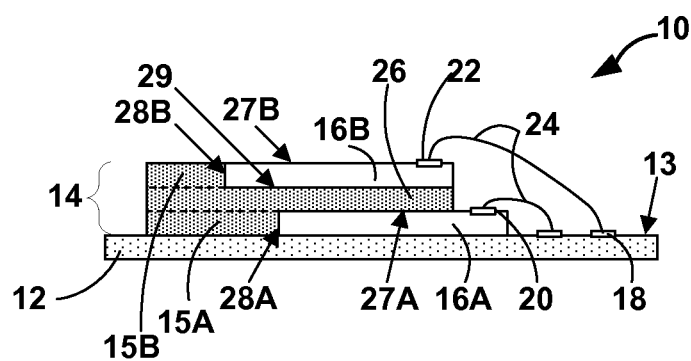
FIG. 1B is a conceptual and schematic diagram illustrating a side view of example stacked IC system of FIG. 1A, which includes two IC dies stacked in a laterally offset pattern.

FIGS. 1A and 1B are conceptual and schematic diagrams illustrating a top view (FIG. 1A) and side view (FIG. 1B) of an example stacked integrated circuit (IC) system 10 including two IC dies 16A and 16B stacked in a single direction lateral offset configuration. In the example shown in FIGS. 1A and 1B, stacked IC system 10 includes a substrate 12, a contour support 14, and a first IC die 16A and a second IC die 16B (collectively, "IC dies 16").

Substrate 12 is substantially planar and defines a substrate major surface 13 on which contour support 14 and IC die 16A are attached. Substrate 12 may be formed with any properties or materials suitable for the particular application for which stacked IC system 10 is intended. In some examples, substrate 12 may be a semiconductor device, may be a printed board (PB), or another device including electrical interconnects for electrically interconnecting IC dies 16 to an external device. In some examples, substrate 12 may be formed of material(s) with particular thermal properties such that substrate 12 helps dissipate heat generated by components of stacked IC system 10, such as IC dies 16. As another example, substrate 12 may be configured to help shield IC dies 16 from EM interference (e.g., radio frequency interference) or may include one or more termination resistors that may reflect electrical signals that may cause interference.

Substrate 12 may include a plurality of interconnect elements. Interconnect elements of substrate 12 may include, for example, substrate bond pads 18, vias, traces, passive circuit elements (e.g., passive resistors, inductors, and capacitors), active circuit elements, metal layers, or other conductive elements positioned on or within substrate 12. The plurality of interconnect elements, e.g., substrate bond pads 18 and the like, may be defined by any suitable electrically conductive material which facilitates electrical communication, such as tungsten, molybdenum, copper, aluminum, silver, gold, or the like. The plurality of interconnect elements of substrate 12 may be configured to transmit electrical signals throughout stacked IC system 10 including for example, between IC dies 16, between IC dies 16 and other components of the system 10, or between IC dies 16 and other components to which substrate 12 connects.

In some examples, passive elements configured to condition electrical signals within the stacked IC system 10 may be positioned within substrate 12. For example, substrate 12 may be formed to include one or more passive resistors, inductors, capacitors, or any combination thereof, which are configured to manipulate signals such that the signals are satisfactory for a subsequent stage of processing. As an example, resistive elements within substrate 12 may be used to pull unused logic circuit inputs to particular states and to achieve particular impedance effects.

Substrate 12, including any interconnect elements (e.g., substrate bond pads 18), may be formed using any suitable technique. For example, substrate 12 may be formed using any suitable semiconductor processing technique in which interconnect elements are formed as part of the back end-of-line (BEOL) processing part of a semiconductor fabrication step. Additionally, in examples in which substrate 12 includes semiconductor components such as transistors, the semiconductor components may be formed using semiconductor processing techniques (e.g., as part of front-end-of-line (FEOL) processing).

IC stacked system 10 includes first IC die 16A having a first die major surface 27A and a second IC die 16B having a second die major surface 27B, which are aligned substantially parallel to substrate major surface 13.

IC dies 16 of slacked IC system 10 may, in some examples, be configured for various signal processing tasks, which may be specific to the application for which IC stacked system 10 is used. Accordingly, the type of IC dies 16 included in system 10 may vary depending on the intended application. For example, IC dies 16 may include one or more die configured for one or more of processing (e.g., co-processor or microprocessor die), memory (e.g., random access memory (RAM) or non-volatile memory (NVM)), power conditioning, ambient monitoring (e.g., temperature and/or health monitoring), sensing, encryption, optics-photonics, or the like.

In some examples, the first IC die 16A may contain a first plurality of IC bond pads 20 (only one IC bond pad 20 is labeled in FIG. 1A for clarity) along first die major surface 27A. Similarly, second IC die 16B may contain a second plurality of IC bond pads 22 (only one IC bond pad 22 is labeled in FIG. 1A for clarity) along second die major surface 27B (collectively referred to as IC bond pads 20, 22). IC bond pads 20, 22 may be used to establish electrical connections between IC dies 16 and other components throughout the stacked IC system 10 depending on the desired application for the system. For example, as shown in FIG. 1A, a wire bond 24 may be used to electrically connect a IC bond pad of first plurality of IC bond pads 20 to a corresponding substrate bond pad of plurality of substrate bond pads 18. Similarly, wire bond 24 may be used to establish electrical connections between a IC bond pad of firm plurality of IC bond pads 20 and a IC bond pad of second plurality of IC bond pads 22 of between a IC bond pad of second plurality of IC bond pads 22 and a substrate bond pad of plurality of substrate bond pads 18. Electrically connecting respective IC bond pads of first or second plurality of IC bond pads 20 or 22 with respective substrate bond pads of plurality of substrate bond pads 18 may be useful in some cases to connect IC dies 16, for example, to a common ground, power source, or signal connection.

While FIGS. 1A and 1B only illustrate electrical connections between respective substrate bond pads of plurality of substrate bond pads 18 and respective IC bond pads of first and second plurality of IC bond pads 20, 22 being made using wire bonding 24, other forms of electrical connection may be utilized to connect two or more corresponding bond pads of plurality of substrate bond pads 18, first plurality of IC bond pads 20, or second plurality of IC bond pads 22. Such examples of the electrical connections may include, for example an electrically conductive resin, a solder, a conductive metal or metal alloy, or the like. Similarly, plurality of substrate bond pads 18, first plurality of IC bond pads 20, and second plurality of IC bond pads 22 may also be electrically connected to other components in the stacked IC system 10 or other components in which system 10 is incorporated.

In the example shown in FIGS. 1A and 1B, plurality of substrate bond pads 18, first plurality of IC bond pads 20, and second plurality of IC bond pads 22 are positioned on the respective surfaces of corresponding IC dies 16 and substrate 12. In other examples, IC dies 16, substrate 12, or both may include bond pads on multiple surfaces that may aid in forming electrical addition connections between IC dies 16 and other components in stacked IC system 10 (e.g., direct electrical connection between IC die 16B and support plate 26).

The plurality of substrate bond pads 18, first plurality of IC bond pads 20, and second plurality of IC bond pads 22 may be defined using any suitable technique, including BEOL semiconductor processing techniques, and may be formed of any suitable electrically conductive material.

In the example shown in FIG. 1A, respective bond pads of plurality of substrate bond pads 18, first plurality of IC bond pads 20, and second plurality of IC bond pads 22 are electrically connected by a respective wire of wires 24. Wires 24 (e.g., aluminum, copper, gold wires) can be electrically and mechanically connected to respective bond pads of plurality of substrate bond pads 18, first plurality of IC bond pads 20, and second plurality of IC bond pads 22 using any suitable technique. For example, wires 24 may be wedge bonded, ball bonded, soldered, or the like to respective bond pads of plurality of substrate bond pads 18, first plurality of IC bond pads 20, and second plurality of IC bond pads 22.

In some examples, the first and second IC dies 16A and 16B may be rectangular in shape and may be the same size. In other examples, IC dies 16 may be non-rectangular in shape and/or may differ in size. IC dies 16 may be processed to be substantially planar (e.g., planar or nearly planar), and incorporated into contour support 14 so that each major surface 27A and 27B is substantially parallel to substrate major surface 13.

In some examples, IC dies 16 may include a die that is not inherently configured for stacking in an IC system, e.g., that do not include through-vias extending completely through the thickness of the die (measured in the direction orthogonal to the surface 13 of substrate 12 in the example shown in FIG. 1B). In this way, the IC dies 16 need not be custom made to be incorporated into system 10 and, instead, may be third party dies and selectively incorporated based on a particular application for which system 10 is intended. Contour support 14 may facilitate stacking IC dies 16, including IC dies 16 that may not be configured for stacking in an IC system.

As shown in FIG. 1B, contour support 14 includes a first support frame 15A, a support plate 26, and a second support frame 15B. First support frame 15A attaches to the substrate major surface 13 and defines a first lateral contact surface 28A that is substantially orthogonal (e.g., orthogonal or nearly orthogonal) to substrate major surface 13. Support plate 26 is on top of first support frame 15A and may be substantially planar in shape defining a support plate major surface 29 that may be aligned over and substantially parallel to substrate major surface 13 so that support plate 26 defines a gap sized to receive IC die 16A. Second support frame 15B is on top of support plate 26 and defines a second lateral contact surface 28B that is substantially orthogonal (e.g., orthogonal or nearly orthogonal) to substrate major surface 13. First and second lateral contact surfaces 28A and 28B are arranged such that the lateral contact surfaces 28A and 28B are laterally offset from one another in a direction substantially parallel to substrate major surface 13. The lateral offset between first and second lateral contact surfaces 28A and 28B may facilitate stacking of IC dies 16 in a staggered arrangement when incorporated into IC system 10.

First IC die 26A attaches to the substrate major surface 13 within the gap between support plate 26 and substrate 12 with a side of first IC die 26A abutting first lateral contact surface 28A and a portion of first die major surface 27A covered by support plate 26. The second IC die 16B may be attached to support plate 26 on the side opposite to first IC die 16, with a side of second IC die 26B abutting second lateral contact surface 28B. As used herein "abut" and "abutting" may indicate physical contact between at least part of one surface with at least part of another surface.

In some examples, IC dies 16 may be mechanically coupled to the adjacent support plate 26 and/or substrate 12 (e.g., IC die 16A coupled to substrate 12 and support plate 26) via an adhesive. The adhesive (not shown) may include any suitable adhesive material configured to mechanically couple IC dies 16 to the adjacent support plate 26 or substrate 12 in stacked IC system 10. For example, the adhesive may comprise an SU-8 adhesive, a benzocyclobutene (BCB) adhesive, or another adhesive that utilizes free-radical, non-condensation-based organic reactions (e.g., an adhesive that does not include ions, water, alcohols, or corrosives). The adhesive may be applied to IC dies 16 using any suitable adhesive bonding technique. In other examples, IC system 10 may include another type of wafer bond to mechanically couple IC dies 16 to corresponding a support plate 26 or substrate 12. For example, in some examples, thermal compression bonding (e.g., copper-to-copper thermal compression bonding or oxide bonding) may be utilized to mechanically couple IC die 16A to substrate 12 in stacked IC system 10.

As shown in FIGS. 1A and 1B, contour support 14 is configured to mechanically contact each of IC dies 16 such that each IC die 16A and 16B has at least one side perpendicular to substrate surface 13 that abuts a portion of contour support 14. Contour support 14 may be configured so that the first and second IC dies 16A, 16B are stacked to form a lateral offset in at least one direction creating, for example, a stair-step style stacking. Support plate 26 may also be laterally offset from the first IC die 16A so that support plate 26 partially covers first major surface 27A of IC die 16A leaving a portion of major surface 27A exposed. The exposed surface of IC die 16A may include the first plurality of IC bond pads 20 allowing for wire bonding 24 of bond pads from first plurality of IC bond pads 20 to other components in stacked IC system 10.

In some examples, contour support 14 may be a formed as a single unitary structure including first and second support frames 15 and support plate 26. In some such examples, the entire contour support 14 may be formed prior to inserting and attaching IC dies 16. In other examples, first support frame 15A, support plate 26, and second support frame 15B of contour support 14 may be distinct physical components assembled sequentially with corresponding IC dies 16 in a step-wise manner as describe in More detail below with respect to FIGS. 4-7. In other examples, contour support 14 may be formed using a combination of these or other techniques.

Contour support 14 may be formed with any properties or materials suitable for lire particular application for which stacked IC system 10 is intended. For example, contour support 14, including at least one of first and second support frames 15 and support plate 26, may include a material that provides mechanical support to contour support 14, provides shielding to IC dies 16 from charged particles, provides magnetic shielding to IC dies 16, provides thermal conductivity for conducting heat from IC dies 16, provides electrical interconnections within or between IC dies 16, is a getter for water or other gases or liquids, or the like. The materials front which each of first support frame 15A, second support frame 15B, and support plate 26 may be independently selected to be the same or different depending on the properties desired for each of first support frame 15A, second support frame 15B, and support plate 26.

In some examples, at least one of first support frame 15A, second support frame 15B, or support plate 26 may include an electrically insulating material, such as an electrically insulating ceramic material. Example ceramic materials from which contour support 14 may be formed include, but are not limited to, alumina ($Al_2O_3$), aluminum nitride (AlN), beryllium oxide (BeO), and silicon carbide (SiC).

In some examples, at least one of first support frame 15A, second support frame 15B, or and support plate 26 may include materials that provide structural support and rigidity to stacked IC system 10. Improving the rigidity of stacked IC system 10 may allow a plurality of IC dies 16 to be stacked within a single stacked arrangement without incurring mechanical failure under normal operating conditions. Materials that may enhance such mechanical features of the system 10 may include, for example, aluminum, anodized aluminum, brass, stainless steels, perforated circuit board material, or the like.

In some examples, at least one of first support frame 15A, second support frame 15B, or support plate 26 may include a thermally conductive material to help dissipate heat generated by components of stacked IC system 10 during operation, e.g., IC dies 16. In such examples, the thermally conductive materials may be included in support frames 15, support plate 26, or both so that support frames 15, support plate 26, or both transfer heat generated by IC dies 16 to another area of system 10, such as, for example, substrate 13 or a heat sink (not shown) attached to contour support 14. Thermally conductive materials that may be useful for dissipating heat include, for example, aluminum, anodized aluminum, brass, copper, silver, gold, alloys including alloys of nickel, iron, and cobalt, or the like. In some examples the thermally conductive materials may have a thermal conductivity in excess of about 10 to 100 watts per meter kelvin ($W/(m \cdot K)$).

In some examples, the thermally conductive materials of contour support 14 may reduce mechanical stresses in stacked IC system 10 resulting from coefficient of thermal expansion (CTE) mismatches that of the components of stacked IC system 10. For example, mechanical stress generated by thermal expansion and CTE mismatches between support plate 26 and IC dies 16 could lead to physical deformation and cause premature failure. In some examples, the thermally conductive materials included in contour support 14 may be selected so that the thermally conductive materials possess good CTE compatibility with adjacent components so that any mechanical stress generated as a result of CTE mismatches is within tolerable limits.

In some examples, at least one of first support frame 15A, second support frame 15B, or support plate 26 may be configured to help shield IC dies 16 from EM interference (e.g., radio frequency interference) or may include one or more termination resistors that may reflect electrical signals that may cause interference. In some examples, at least one of first support frame 15A, second support frame 15B, or support plate 26 may include materials that have EM shielding properties including, for example, nickel/iron, nickel/iron/molybdenum, alloys of nickel/iron or nickel/iron/molybdenum, or the like.

In some examples, at least one of first support frame 15A, second support frame 15B, or support plate 26 may include a ferromagnetic material that shields at least one of IC dies 16 from external magnetic fields. For example, one or more of IC dies 16 may include magnetoresistive random access memory (MRAM) or another type of IC die sensitive to magnetic fields. By including at least one of first support frame 15A, second support frame 15B, or support plate 26 including a ferromagnetic material, IC system 10 may be less sensitive to external magnetic fields.

In this way, contour support 14 may provide mechanical support and arrangement of IC dies 16 and, in some examples, may provide additional functionality to stacked IC system 10.

In some examples, slacked IC system 10 may be incorporated into a larger system using any suitable technique. For example, stacked IC system 10 may be incorporated into an IC package (not shown), which may provide protection of stacked IC system 10 contained therein against environmental contaminants. For example, the IC package may hermetically enclose stacked IC system 10. Additionally or alternatively, the IC package may aid in dissipating heat generated by stacked IC system 10 enclosed therein or improve the EM shielding for system 10. In some examples, the IC package may also facilitate mounting of stacked IC system 10 onto a printed board, e.g., using solder balls, conductive pins, solder columns, and the like. In other examples, stacked IC system 10 may be directly mechanically and electrically connected to a printed board, without being disposed in an IC package.

Stacked IC system 10 may be packaged in any suitable manner using any suitable packaging technique known in the art. For example, slacked IC system 10 may be packaged in a package including an electrically conductive material such as aluminum silicon carbide (AlSiC), copper tungsten (CuW), copper molybdenum (CuMo), a nickel cobalt ferrous alloy (e.g., an alloy provided under the trademark Kovar®, made available by Carpenter Technology Corporation of Reading Pa.), or the like. As another example, stacked IC system 10 may be packaged in a package including an electrically insulating ceramic material, such as aluminum oxide, aluminum nitride (AlN), beryllium oxide (BeO), and silicon carbide (SiC). In some examples, stacked IC system 10 may be packaged in a package including materials that are thermally conductive or include a polymeric material, such as a polytetratluoroethylene (PTFE)/ceramic based laminate (e.g., Rogers RO2800 laminate, which is made commercially available by Rogers Corporation of Rogers, Conn.) or fluoropolymer materials (e.g., fluoropolymers made commercially available by W.L. Gore and Associates of Newark, Del.), FR-4, BT-Epoxy, or polyimide.

FIGS. 1A, 1B depict an arrangement where IC dies 16 are assembled in contour support 14 so that the dies 16 are laterally offset from one another in one direction. In some examples, contour support 14 may be configured so that IC dies 16 are laterally offset in more than one direction. For example, in some examples IC dies 16 may be laterally offset in two or three directions. Such configurations may be obtained by using, for example, IC dies 16 of different sizes, where the dies 16 are stacked outward from the substrate surface 13 in the order of largest to smallest dies. Such configurations may allow for two or three perimeter surfaces of the larger IC dies 16 to be exposed when the subsequent smaller dies are incorporated into contour support 14.

Figure 2A:
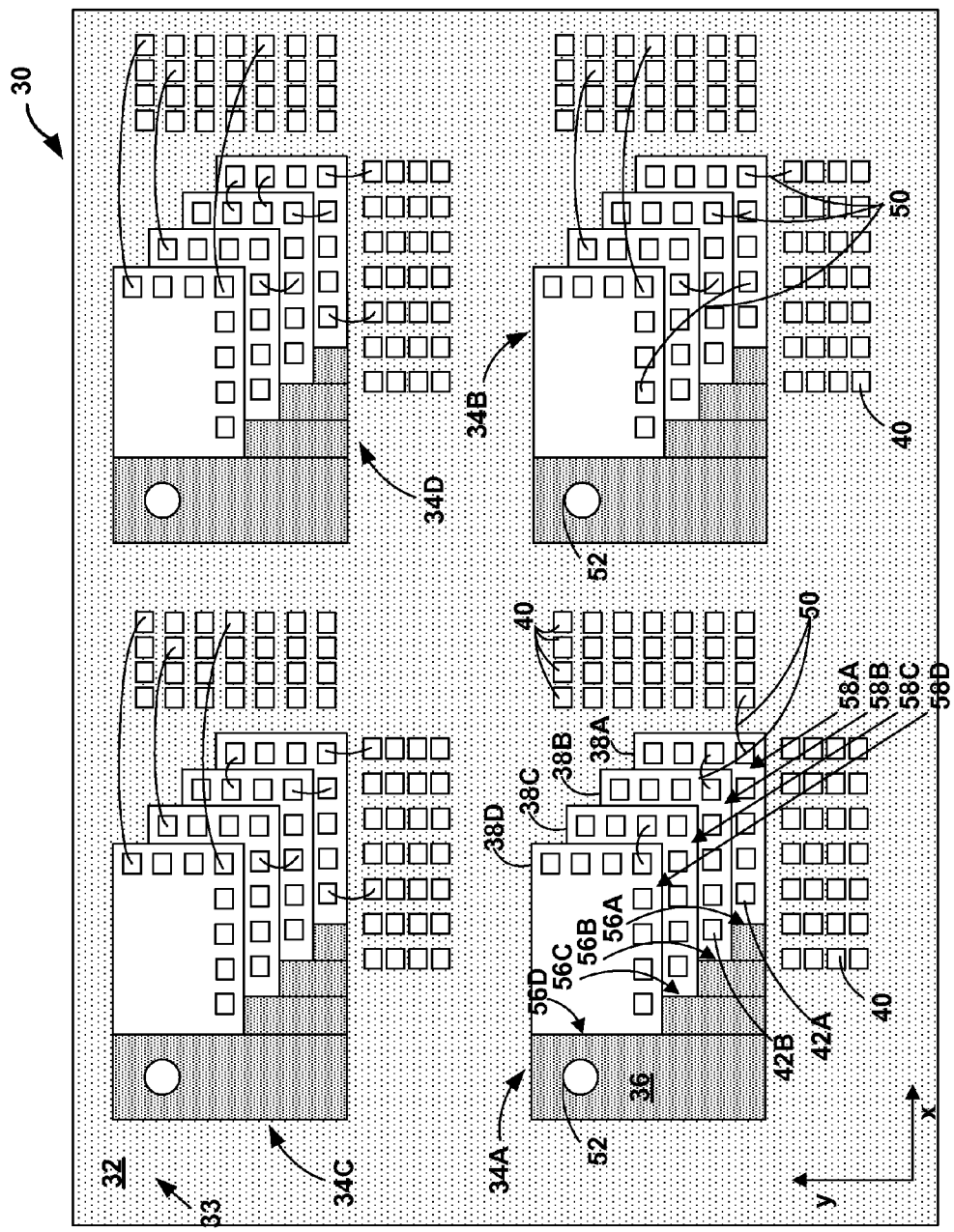
FIG. 2A is a conceptual and schematic diagram illustrating a top view of an example IC system including multiple stacked arrangements of IC dies.
Figure 2B:
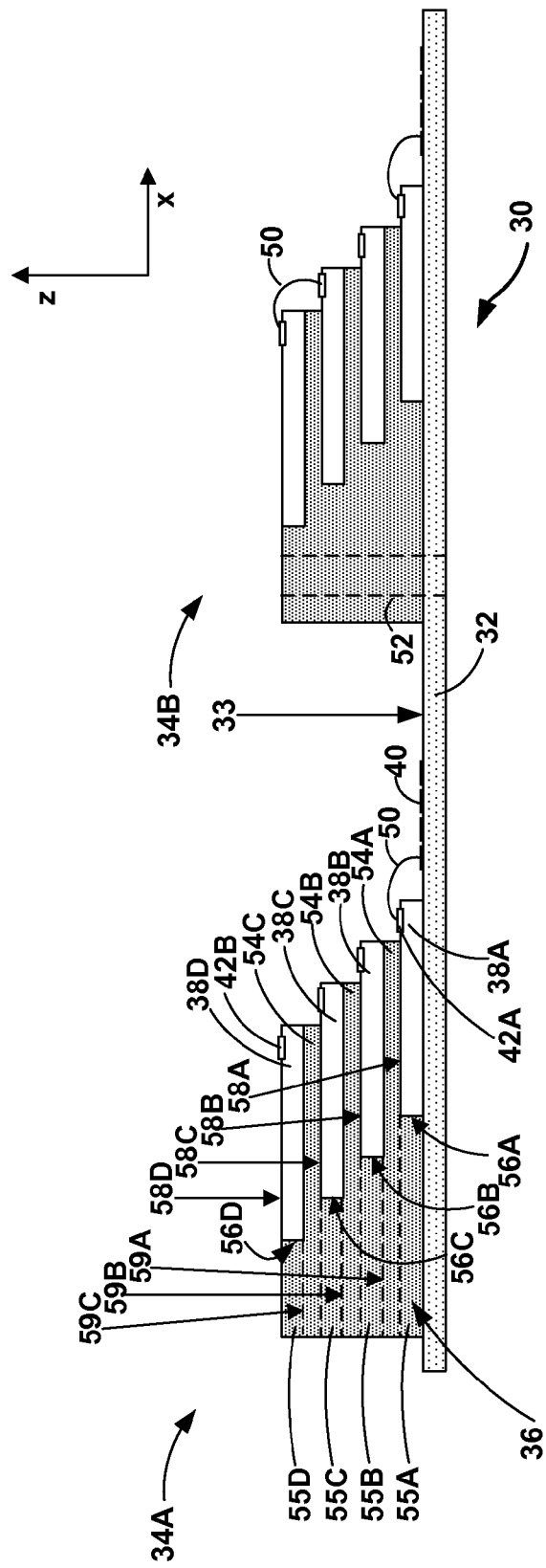
FIG. 2B is a conceptual and schematic diagram illustrating a side view of the example IC system of FIG. 2A, which includes multiple stacked arrangements of IC dies.

In another example, IC dies 16 may be the same size and laterally offset in two directions. For example, FIGS. 2A and 2B illustrate a conceptual and schematic top (FIG. 2A) view and a conceptual and schematic side view (FIG. 2B) of an example IC system 30 that includes multiple stacked arrangements of IC dies 34A, 34B, 34C, 34D (collectively, "IC stacks 34") attached to a substrate major surface 33 of substrate 32. For purposes of clarity, IC stacks 34 are described in reference to IC stack 34A. The descriptions provided, however, are intended to apply to any of IC stacks 34 of system 30.

As shown in FIG. 2B, IC stack 34A includes a plurality of IC dies 38A-38D (collectively, "IC dies 38") assembled with a contour support 36. Contour support 36 includes a plurality of support frames 55A-55D (collectively, "support frames 55") and a plurality of support plates 54A-54C (collectively, "support plates 54") stacked in an alternating arrangement orthogonally from substrate major surface 33. Each support plate of support plates 54 is substantially planar in shape and includes a respective support plate major surface of support plate major surfaces 59A-59C aligned above and substantially parallel to substrate major surface 33.

Similarly, each IC die of IC dies 38 includes a corresponding die major surface of die major surfaces 58A-58D (e.g., IC die 38D includes die major surface 58D) aligned substantially parallel to substrate major surface 33. Support plates 54 are configured in a staggered arrangement with support frames 55 providing space between adjacent plates 54 to receive a corresponding IC die of IC dies 38. For example, in IC stack 34A, the support plates 54 and IC dies 38 are arranged such that first IC die 38A is attached to substrate 32 and first support plate 54A is attached to first die major surface 58A of IC die 38A. Second IC die 38B is attached to first support plate major surface 89A of first support plate 54A, and second support plate 54B is attached to second die major surface 58B of second IC die 38B. Third IC die 38C is attached to second support plate major surface 89B of second support plate 54B with third support plate 54C attached to third die major surface 58C of third IC die 38C. Further fourth IC die 38D is attached to third support plate major surface 89C of third support plate 54C. While only four IC dies 38 are illustrated in FIGS. 2A and 2B, IC stack 34A may contain more or fewer IC dies 38 depending on the intended purpose for IC system 30.

In some examples, each support frame 54 has at least one respective lateral contact surface 56A-56D (collectively, "lateral contact surfaces 56") aligned substantially orthogonal (e.g., orthogonal or nearly orthogonal) to substrate surface 33 and configured to physically pair with a corresponding IC die of IC dies 38 so that each respective IC die of IC dies 38 has at least one side that abuts a respective lateral contact surface of lateral contact surfaces 56. For example, support frame 55A includes first lateral contact surface 56A that abuts one side of first IC die 38A. As shown in FIG. 2A, IC dies 38 may be positioned adjacent to contour support 36 so IC dies 38 are laterally offset from one another in at least two directions (e.g., the x-axis and y-axis directions as shown). In some examples, the lateral offset of adjacent IC dies 38 may be substantially uniform and repetitive across the entire IC stack 34A (e.g., a consistent displacement in an x-direction and a y-direction as shown in FIG. 2A). In other examples, the lateral offset may be non-uniform or non-repetitive within IC stack 34A.

In some examples, support plates 54 may also be laterally offset with respect to one of the adjacent IC dies 38. For example, in stack 34A, first and second IC dies 38A and 38B are positioned on (e.g., attached to) opposite sides of first support plate 54A. Respective edges of second IC die 38B and first support plate 54A are laterally aligned and latterly offset from an edge of first IC die 38A in both the x-axis and y-axis directions; however, the edges of second IC die 38B and first support plate 54A are not laterally offset with respect to each other in the x-axis and y-axis directions. In this manner, first support plate 54A partially covers first IC die 38A leaving first IC die major surface 58A partially exposed along two perimeter portions of IC first die 38A.

In some examples, the exposed portions of the topsides of IC dies 38 may contain a plurality of IC bond pads 42, which may be used to form electrical connections (e.g., via wires 50) between IC dies 38 and other components in IC system 30. For example, as shown in FIG. 2A, first IC die 38A includes a plurality of first IC bond pads 42A (only one IC bond pad is labeled in FIG. 2A for clarity). Wires 50 may be used to form electrical connections between respective IC bond pads of first IC bond pads 42A and another component in system 30 including, for example, a corresponding substrate bond pad 40 located on substrate major surface 33 or a corresponding IC bond pad of another IC she in IC stack 34A, e.g., IC bond pad 42B of second IC die 38B. In some examples, IC dies 38 may also be electrically connected to other components in IC stack 34, system 30, or other components in which system 30 is incorporated.

In some examples, contour support 36 may define a mounting aperture 52 extending substantially through contour support 36. In some examples, mounting aperture 52 also may extend through substrate 32. Mounting aperture 52 may be aligned so that it extends substantially orthogonally (e.g., orthogonally or nearly orthogonally) to the surface of substrate 32. Mounting aperture 52 may be placed anywhere in contour support 36 such that the mounting aperture 52 does not physically interfere with the stacking arrangements of IC dies 38. Additionally, mounting aperture 52 may be of any shape, including, for example, a cylindrical or polygonal tube. In some examples, mounting aperture 52 may receive a mounting post (not shown) that facilitates mounting one or more IC systems 30 within a single device. In some examples, mounting aperture 52 may also allow for additional components to be attached and secured to IC stacks 34 such as a compression plate mounted to the topside contour support 36 that secures IC stacks 34 and/or the IC dies 38 within IC stacks 34.

In some examples, mounting aperture 52 may contain or be coated with a thermally conductive material to provide a low thermal impedance, thermally conductive path through IC stacks 34. In some such examples, IC stack 34 may be configured to allow heat to flow from IC dies 38, through corresponding support plates 54 to the mounting aperture 52. In some examples, a heat sink or other device designed to assist in cooling IC system 30 may then be attached to mounting aperture 52, thereby further dissipating heat originating from IC dies 38.

Figure 3A:
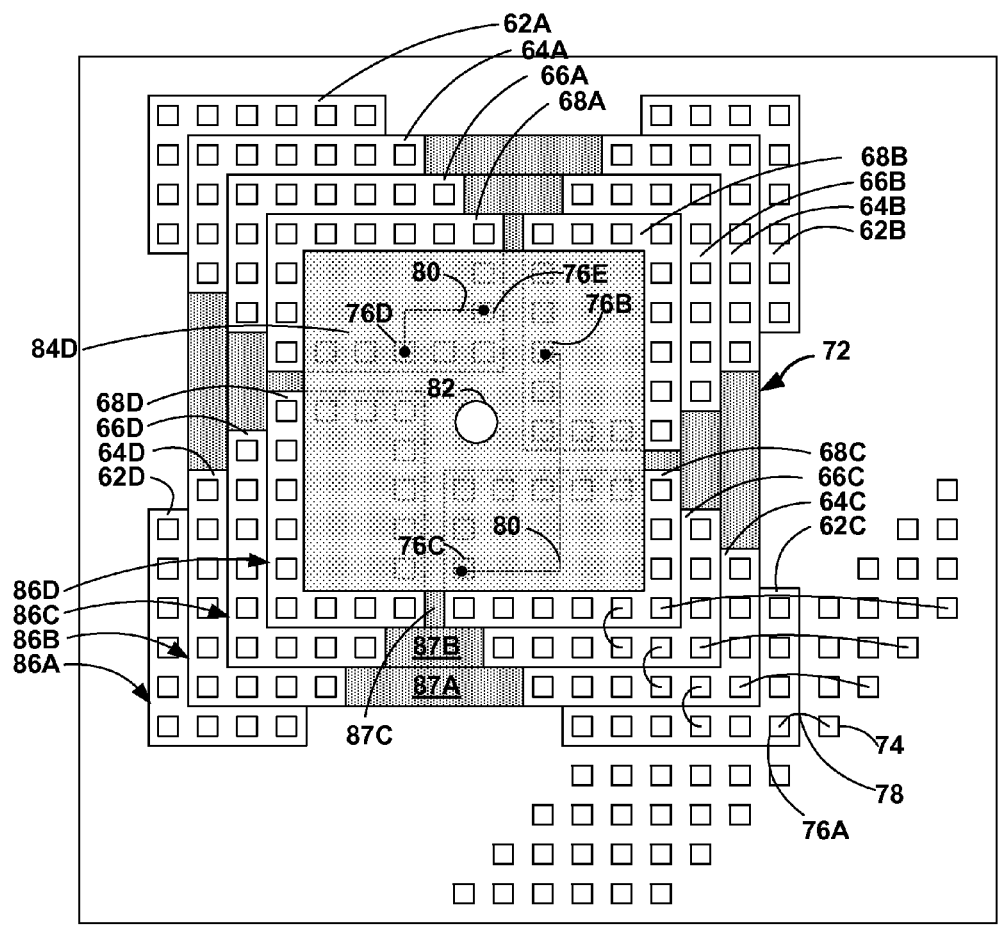
FIG. 3A is a conceptual and schematic diagram illustrating a top view of an example stacked IC system including stacked tiers including a plurality of IC dies.
Figure 3B:
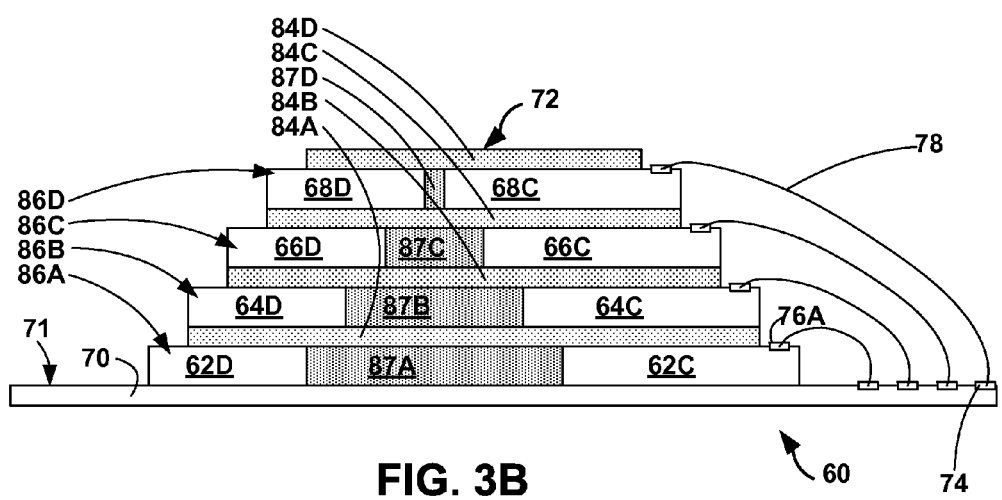
FIG. 3B is a conceptual and schematic diagram illustrating a side view of the example stacked IC system of FIG. 3A, which includes stacked tiers including a plurality of IC dies.

Although FIGS. 1A-2B have illustrated examples in which IC dies are located on one side of a contour support, in other examples, a stacked IC system may include a plurality of IC dies in each of a plurality of tiers. In at least one of the tiers, the respective plurality of IC dies may substantially surround (e.g., surround or nearly surround) a respective support frame. By including a plurality of IC dies around a support frame, the density of IC dies may be further increased compared to the examples shown in FIGS. 1A-2B. FIGS. 3A and 3B illustrate another example of an IC system 60 in accordance with the disclosure. In particular, FIGS. 3A and 3B are conceptual and schematic top (FIG. 3A) and side (FIG. 3B) views of an example stacked IC system 60 that includes a substrate 70 having a substrate major surface 71, a contour support 72 including a plurality of support frames 87 and a plurality of support plates 84 arranged to create multiple tiers 86A-86D (collectively, "tiers 86"). Each tier or tiers 86 includes a respective support frame of support flames 87 and a respective plurality of IC dies. For example, system 60 includes a first tier 86A that includes a first support frame 87A and a first plurality of IC dies 62A-62D, a second tier 86B that includes a second support frame 87B and a second plurality of IC dies 64A-64D, a third tier 86C that includes a third support frame 87C and a third plurality of IC dies 66A-66D, and a fourth tier 86D that includes a fourth support frame 87D and a fourth plurality of IC dies 68A-68D.

In some examples, tiers 86 may be in the shape of a plane and aligned substantially parallel to the surface of substrate 70. Tiers 86 may be stacked, in some examples, in a square-pyramidal configuration with each successive tier farther away from substrate 70 and sequentially smaller in lateral extent than the previous tier. In some such examples, a corresponding stack of IC dies (e.g., dies 62C, 64C, 66C, and 68C (collectively IC dies 62C-68C)) may be stacked and arranged so adjacent dies (e.g., dies 62C and 64C) are laterally offset in at least one direction (e.g., two directions as shown in FIG. 3A) with each successively stacked die farther away from substrate 70 and closer toward the center of contour support 72 defined by a mounting aperture 82. The stacking arrangement may be repeated for each set of corresponding stacked IC dies (e.g., IC dies 62A-68A, IC dies 62B-68B, and IC dies 62D-68D) creating a high density packing of IC dies, which may be useful in a variety of applications.

Figure 5A:
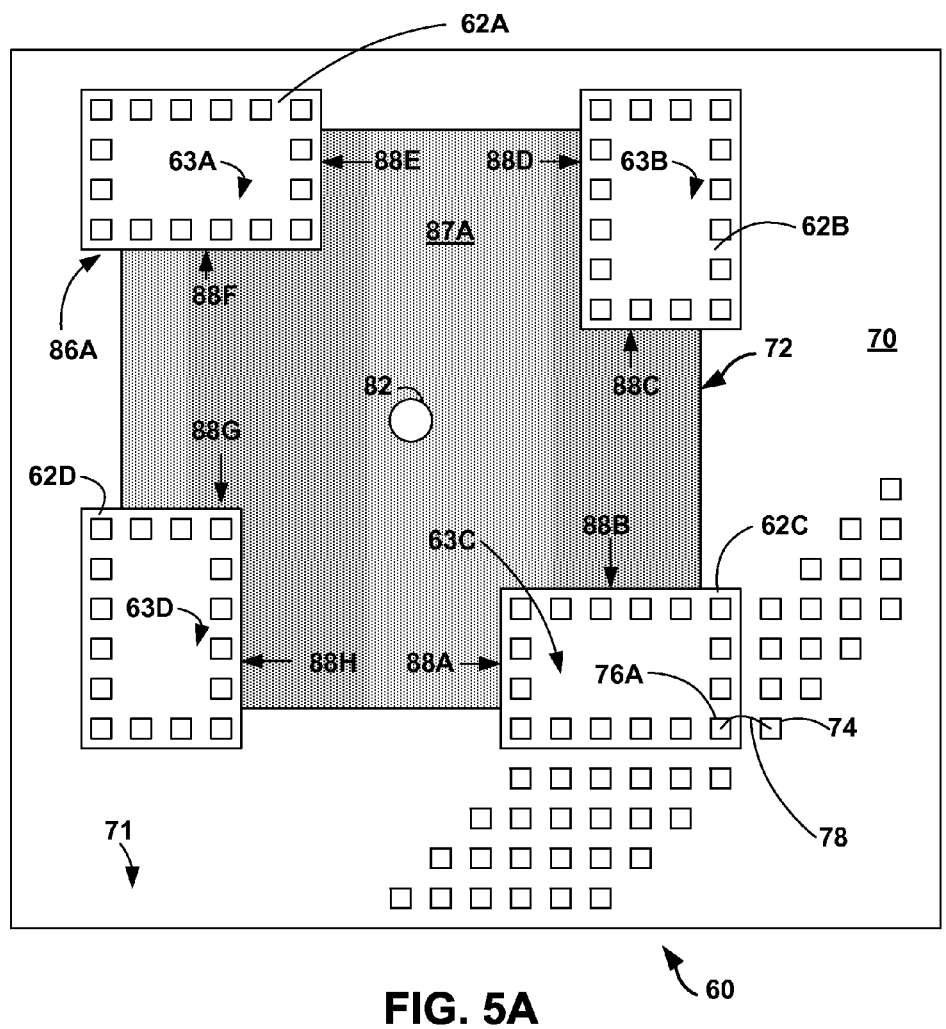

In the example shown in FIGS. 3A and 3B, each tier 86 includes four IC dies (e.g., first plurality of IC dies 62A-62D) and a portion of contour support 72 (e.g., support frame 87A). Each support frame 87 includes a plurality of lateral contact surfaces aligned substantially orthogonal (e.g., orthogonal or nearly orthogonal) to substrate major surface 71. For example, as best shown in FIG. 5A, first support frame 87A contains a first plurality of lateral contact surfaces 88A-88H (collectively, "lateral contact surfaces 88"). Lateral contact surfaces 88 may be configured to physically pair with a corresponding IC dies of the first plurality of IC dies 62A-62D so that at least two sides of each IC die 62A-62D abut at least two lateral contact surfaces 88. For example, to sides of IC die 62C abut lateral contact surfaces 88A and 88B.

In some examples, contour support 72 includes a plurality of support plates 84A-84D (collectively support plates 84) that are substantially planar in shape and extend laterally outward from the center portion of contour support 72 defined by mounting aperture 82. Support plates 84 may be positioned substantially parallel to one another and configured in a staggered arrangement with corresponding support frames 87 separating adjacent support plates 84. For example, as shown in FIGS. 3A and 3B, stacked IC stack 60 is configured with tier 86A, which includes first support frame 87A and first plurality of IC dies 62, attached to substrate major surface 71, with support plate 84A attached to the topside of tier 86A; with tier 86B attached to the topside of support plate 84A; with support plate 84B attached to the topside of tier 86B; with tier 86C attached to the topside of support plate 84B; with support plate 84C attached to the topside of tier 86C; with tier 86D attached to the topside of support plate 84C; and with support plate 84D attached to the topside of tier 86D. While only four tiers 86 are illustrated in FIGS. 3A and 3B, stacked IC system 60 may contain more or fewer tiers 86 depending on the intended purpose for system 60. Additionally, each tier 86 may contain more or fewer IC dies 62, 64, 66, and 68 resulting in different stacking arrangements, e.g., trigonal-pyramidal, hexagonal-pyramidal, or the like.

In some examples, IC dies within a respective tier of tiers 86 may be configured to perform similar functions including, for example, memory storage, processing, or the like. In other examples, IC dies with a respective tier of tiers 86 may be configured to perform different functions. Similarly, in some examples, each tier of tiers 86 may include IC dies configured to perform similar functions, such that all IC dies 62, 64, 66, and 68 in stacked IC system 60 perform the same function, or at least one tier of tiers 86 may include IC dies configured to perform different functions that at least one other tier of tiers 86. For example, tier 86A may include IC dies 62 that are dedicated to performing system operations while tiers 86B-86D include IC dies 64, 66, and 68 dedicated to memory storage.

In some examples, each tier of tiers 86 can have a substantially similar thickness (measured in a direction substantially perpendicular to substrate major surface 71), while in other examples, at least two tiers of tiers 86 have different thicknesses. The thickness of each tier 86 can be selected based on various factors, such as the thickness of the plurality of IC dies (e.g., IC dies 62) to be incorporated in the corresponding tier (e.g., tier 84A). In some examples, the thickness of the tiers 86 may be thicker than the corresponding IC dies 62, 64, 66, 68 to allow for the corresponding dies to be inserted and attached to contour support 72 during manufacturing of stacked system 60.

In some examples, support plates 84 may partially cover the topside of the corresponding IC tier 86 to which support plate 84 attaches. For example, as shown in FIG. 3A, support plate 84D partially covers tier 86D, leaving two perimeter portions on the respective major surfaces of each IC die of IC dies 68A-68D partially exposed.

In some examples, the partially exposed major surfaces of IC dies 62, 64, 66, and 68 may contain a plurality of IC bond pads, e.g., IC bond pad 76A of IC die 62C, that may be used to form electrical connections, e.g., using wires 78, between respective IC dies of IC dies 62, 64, 66, and 68 and other components in system 60. For example, as shown in FIG. 3A, IC bond pad 76A of third IC die 62C may be electrically connected to a corresponding substrate bond pad 74 located on the substrate major surface 71 using a wire 78. IC dies 62, 64, 66, and 68 may also be electrically connected to other components in stacked IC system 60 or other components in which system 60 is incorporated.

In some examples, support plates 84 may include at least one electrically conductive trace 80. For example, support plates 84 may include a ceramic, a polymer, a plastic, a semiconductor, or the like, which may include at least one electrically conductive trace 80. In some examples, at least one electrical trace 80 may be used to make an electrical connection between a first IC die and a second IC die of IC dies 62, 64, 66, or 68. For example, as shown in FIG. 3A, a respective electrical trace of electrical traces 80 may be used to electrically connect IC dies 68B and 68C (e.g., respective bond pads on IC dies 68B and 68C) to one another. In some such examples, the electrical trace of electrical traces 80 may be attached to corresponding IC bond pads 76B and 76C of IC dies 68B and 68C that are covered by support plate 84D. Additionally or alternatively, electrical traces 80 may be configured to transmit electrical signals between two or more IC bond pads of a single IC die (e.g., IC bond pads 76D and 76E of IC die 68A as shown in FIG. 3A), two or more IC dies of different tiers (e.g., between IC dies 66C and 68C of tiers 86C and 86D respectively using support plate 84C—not illustrated), or the like.

The plurality of electrical traces 80 may be formed in support plates 84 using any applicable technique including, for example, forming traces 80 as part of the fabrication of support plates 84. For example, a plurality of metal layers may be deposited onto a dielectric material using planar copper dual damascene interconnect technology; tungsten polished local interconnect technology, or planarized subtractive aluminum interconnect technology; or printed, plated, or the like on a dielectric material; or some combination of these techniques during formation of support plates 84. The traces 80 may be defined by any suitable electrically conductive material which facilitates electrical communication, such as tungsten, molybdenum, copper, aluminum, silver, or gold. The electrical connections between traces 80 and covered bond pads 76 of IC dies 62, 64, 66, and 68 may be establish using any suitable means including, for example, brazing, soldering, or the like.

In some examples, each of support plates 84 may perform a similar function (e.g., electrical interconnection, mechanical support, radiation shielding, magnetic shielding, thermal conductivity, EM shielding, or any other function described herein) and may include a similar construction, aside from dimensional differences used to form the stepped structure described herein. In other examples, at least one of support plates 84 may include a different function than at least one other of support plates 84 and, accordingly, may include a different construction to accomplish the different purpose. In some examples, the purpose of each support plate of support plates 84 may be affected by the function of the adjacent IC dies of IC dies 62, 64, 66, and 68. For example, if a tier of IC dies (e.g., tier 86A) includes MRAM dies, the adjacent support plate (e.g., support plate 84A) may include a ferromagnetic material, which provides magnetic shielding to the MRAM dies. As another example, if a tier of IC dies (e.g., tier 86C) includes a plurality of processors, an adjacent support plate (e.g., support plates 84B and/or 84C) may provide electrical interconnection, thermal conductivity, or both. Other examples are contemplated by the disclosure and will be apparent based on the description.

The thickness of support plates 84 also may be selected based on various factors including, for example, to facilitate the best shape or configuration of wires 78 that electrically connect the IC dies 62, 64, 66, and 68 to other components in stacked IC system 60. For example, incorporating a thicker support plate 84 may provide a greater separation distance between two wires 78 attached to adjacent tiers 86 (e.g., tiers 86A and 86B), which may prevent accidental contact or transmission of signal noise through electromagnetic coupling or interference. Additionally, a thicker support plate 84 may help reduce the possibility of a short circuit (e.g., conductive portions of wires 78 contacting each other) or an undesirable electrical connection between two or more stacked tiers 86. As other examples, thicker support plates 84 may provide greater mechanical support, EM, magnetic, or radiation shielding, heat transfer, or the like. However, thicker support plates 84 also may result in a larger stacked IC system 60.

In some examples, contour support 72 may define mounting aperture 82, which extends substantially through contour support 72 and substrate 70. Mounting aperture 82 may be aligned so that it extends substantially orthogonally (e.g., orthogonally or nearly orthogonally) to substrate major surface 71. Mounting aperture 82 may be placed anywhere within contour support 72 so that mounting aperture 82 does not physically interfere with the stacking arrangements of plurality of IC dies 62, 64, 66, and 68. For example, mounting aperture 82 may be formed at the center of contour support 72. In some examples, a component may extend through mounting aperture 82 to provide a thermal pathway for dissipating heat from stacked IC system 60, to exert a compressive force on stacked IC system 60 in the direction substantially orthogonal (e.g., orthogonal or warty orthogonal) to substrate major surface 71, or both.

In some examples stacked IC system 60 may include more or fewer IC dies 62, 64, 66, and 68 than those illustrated in FIGS. 3A and 3B. For example, stacked IC system 60 may include a power of two ($2^n$) number of IC dies, including for example, $2^8$=256 dies, $2^9$=512 dies, $2^{10}$=1024 dies, or the like. Such pluralities of IC dies may be useful in certain applications such as in memory device applications. In some examples, IC dies 62, 64, 66, 68 may be substantially the same size while in other examples the sizes of IC dies may vary.

Figure 4A:
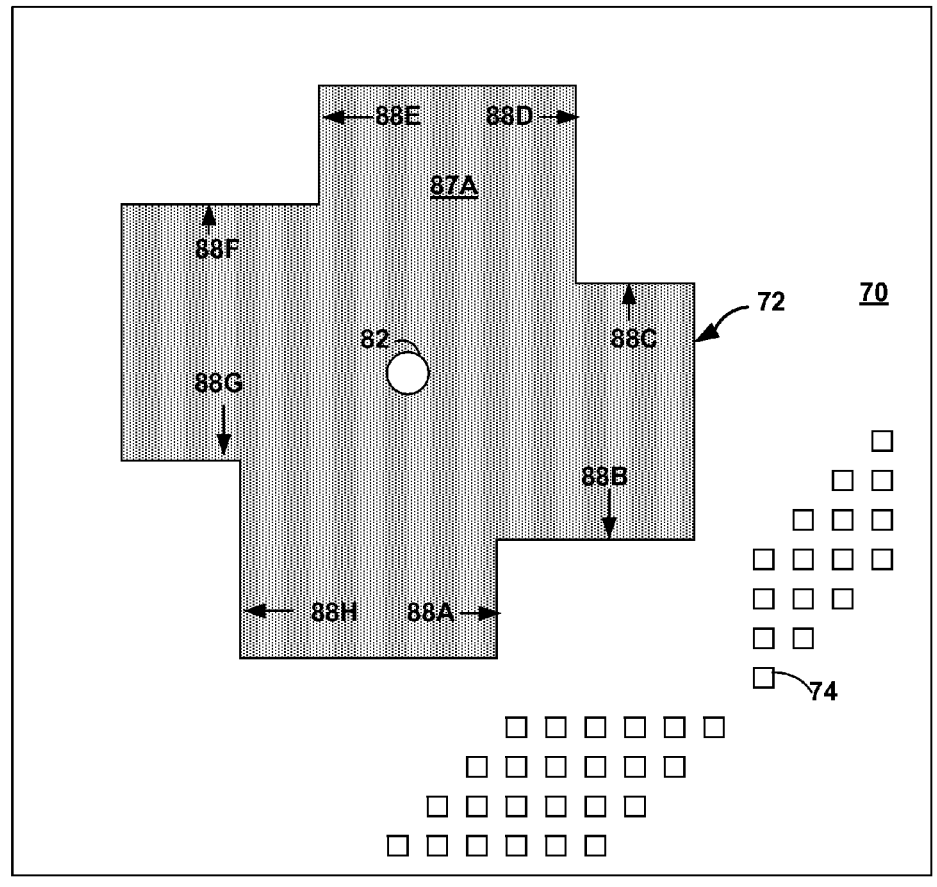
FIGS. 4A, 5A, 6A, and 7A are conceptual and schematic diagrams illustrating top views of an example stacked IC system constructed on a tier-by-tier basis.
Figure 4B:
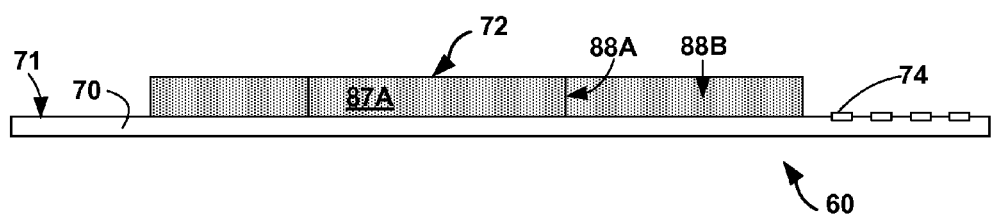
FIGS. 4B, 5B, 6B, and 7B are conceptual and schematic diagrams illustrating side views of an example stacked IC system constructed on a tier-by-tier basis.

Stacked IC system 60 may be formed using any one of a variety of techniques. In some examples, stacked IC system 60 may be formed is a sequential fashion on a tier-by-tier basis. For example, FIGS. 4-7 are conceptual and schematic diagrams illustrating an example of a sequential build for forming stacked IC system 60, with FIGS. 4A-7A showing conceptual and schematic top views and FIGS. 4B-7B showing conceptual and schematic side views of stacked IC system 60 at various stages of assembly. As shown in FIGS. 4A and 4B, stacked IC system 60 may be formed by first attaching first support frame 87A of contour support 72 to substrate major surface 71. First support frame 87A includes a plurality of first lateral contact surfaces 88A-88H that are substantially perpendicular (e.g., perpendicular or nearly perpendicular) to substrate major surface 71. In some examples, first support frame 87A may be prefabricated separately from substrate 70 and attached to substrate 70 via any applicable technique including, for example, an adhesive. Optional mounting aperture 82, may be formed in sequence with the construction of stacked IC system 60 or alternatively may be etched or machined through contour support 72 and substrate 70 after contour support 72 has been substantially formed.

Figure 5B:
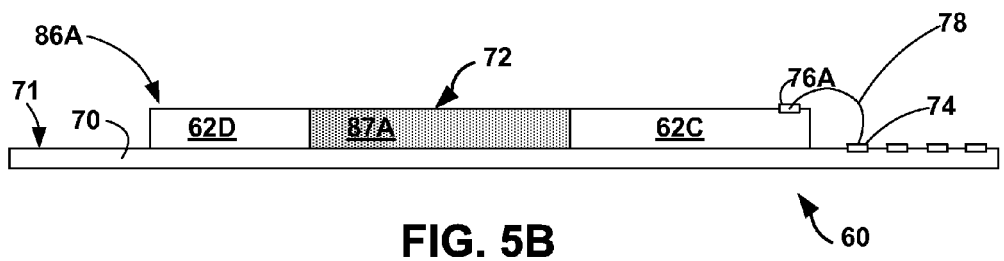

FIGS. 5A and 5B show IC dies 62A-62D assembled on and attached to substrate major surface 71. IC dies 62A-62D include respective first die major surfaces 63A-63D aligned substantially parallel to substrate major surface 71. As shown, each IC die 62 is aligned so that two sides of each die abut respective lateral contact surfaces of the first lateral contact surfaces 88 of first support frame 87A (e.g., two sides of IC die 62A abut first lateral contact surfaces 88E and 88F, respectively). The combination of IC dies 62 and first support frame 87A shown in FIGS. 5A and 5B form first IC tier 86A. Once the IC dies 62 have been incorporated into stacked IC system 60, any desired electrical connections between the IC dies 62 and substrate 70 may be formed via, for example, wires 78 between IC bond pads, e.g., 76A, and substrate bond pads 74 located on first die major surfaces 63 and substrate major surface 71, respectively. While for clarity purposes, only IC die 62C is shown in FIGS. 5A and 5B as being electrically connected to substrate bond pads 74, all IC dies 62, 64, 66, and 68 incorporated into stacked system 60 may include such connections. IC dies 62 may be attached to substrate major surface 71, e.g., using an adhesive, such as an epoxy.

Figure 6A:
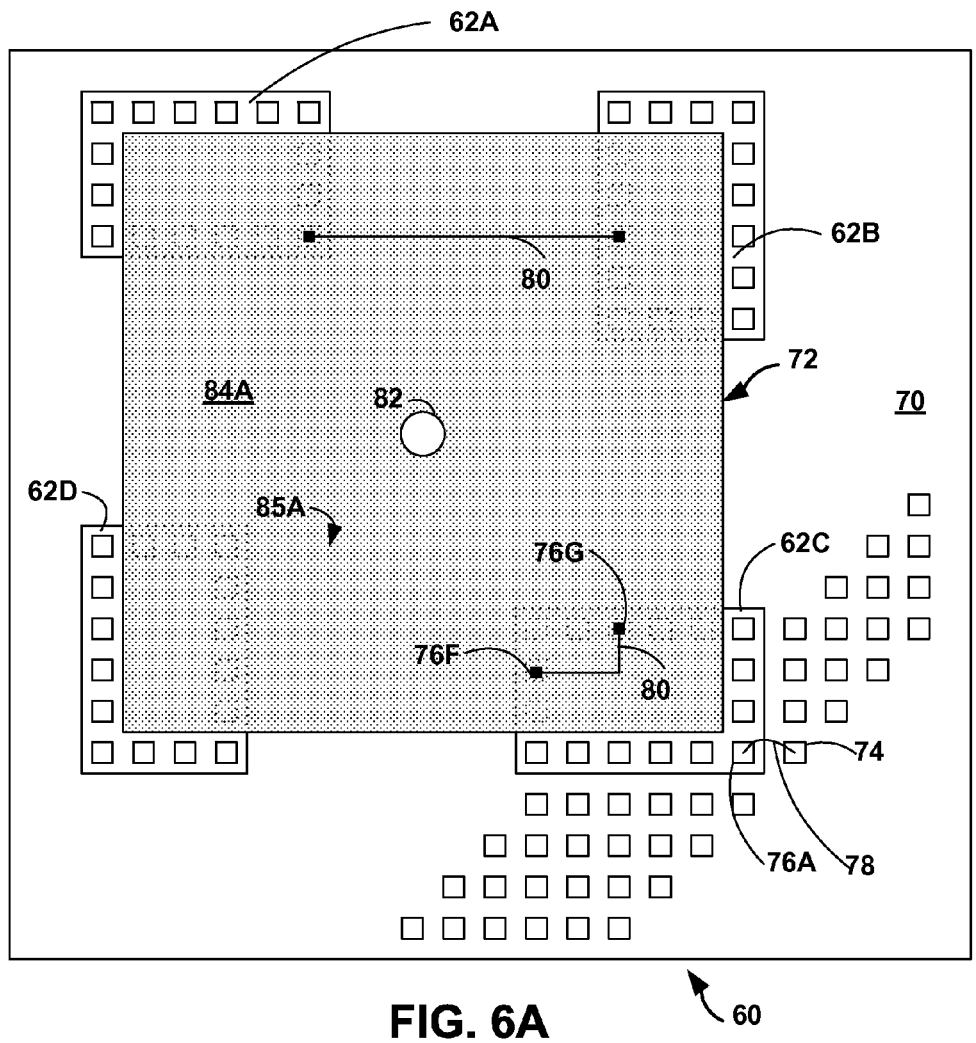
Figure 6B:
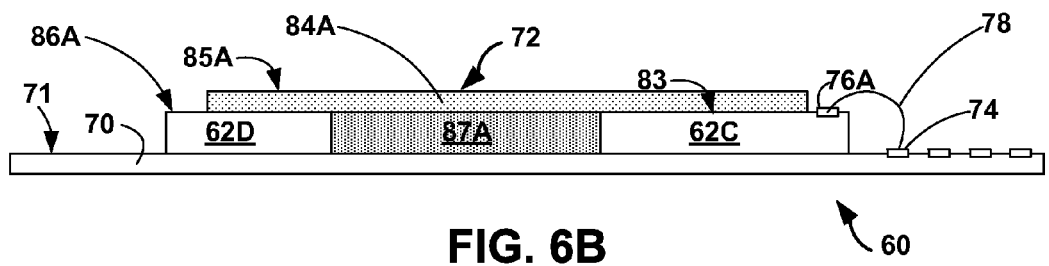

FIGS. 6A and 6B show first support plate 84A of contour support 72 being assembled on stacked IC system 60. First support plate 84A has a first support plate major surface 85A aligned substantially parallel to substrate major surface 71. As shown in FIG. 6A, in some examples, first support plate 84A may partially cover each of IC dies 62, but may leave respective portions of first die major surfaces 63A-63D of IC dies 62 exposed. For example, first support plate 84A may be sized to leave at least some IC bond pads 76 of IC dies 62 exposed. In some examples first support plate 84A may be prefabricated and attached to tier 86A using, for example, any adhesive available from a variety of suppliers that is compatible with stacked IC system 60. In other examples, the support plate 84A may be fabricated directly on the topside of tier 86A using for example, mechanical attachment including fixturing such as with screws or other mechanical fasteners, bonding including chemical bonding or physical/mechanical bonding, a hybrid the techniques, or the like.

In some examples, first support plate 84A may include at least one electrical trace 80 that electrically connects one or more IC dies 62 that are covered by first support plate 84A using, for example, IC bond pads 76F and 76G of IC die 62C. In some examples, the at least one electrical trace 80 may also be used to electrically connect IC dies of adjacent tiers, for example, one or more of IC dies 62 of tier 86A may be electrically connected to one or more of IC dies 64 of tier 86B, which attaches to first support plate major surface 85A. In some such examples, IC dies 64 may include a plurality of IC bond pads located on the lower surface of dies 64 (not shown) that attach to first support plate major surface 85A and electrically communicate with electrical traces 80 in first support plate 84A.

Figure 7A:
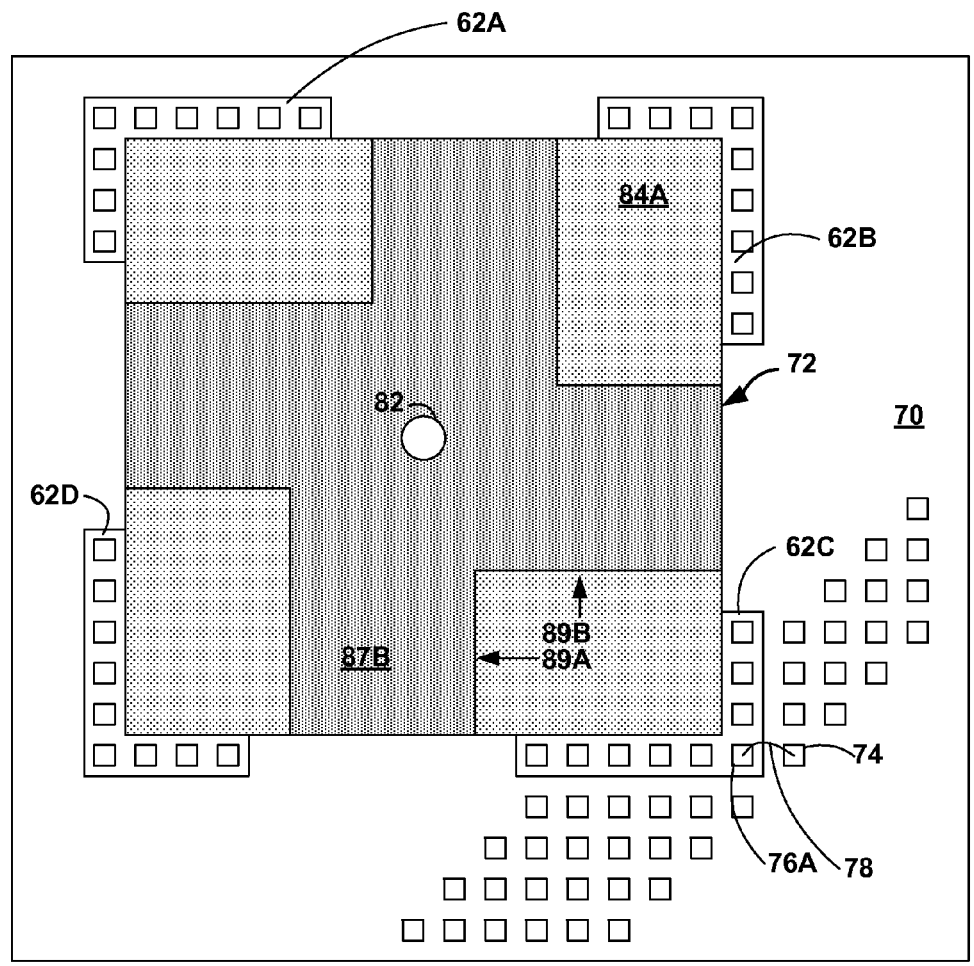
Figure 7B:
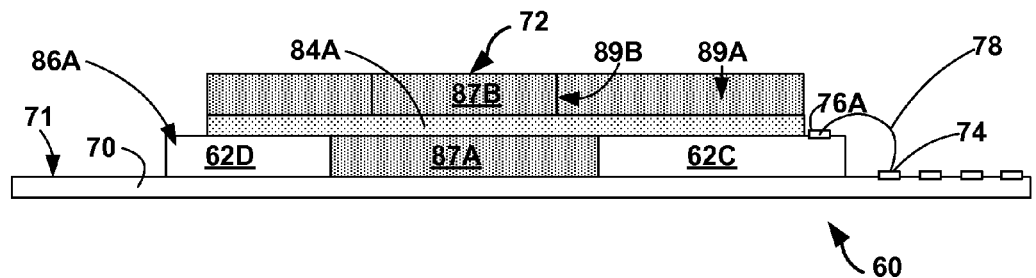

FIGS. 7A and 7B show stacked IC system 60 with the addition of second support frame 87B including a plurality of second lateral contact surfaces 89 (only surfaces 89A and 89B are labeled) substantially perpendicular to substrate major surface 71. IC dies 64 may be incorporated in second tier 86B such that each IC die 64A-64D is placed on first support plate major surface 85A with two sides of each IC die 64A-64D abutting respective second lateral contact surfaces 89 (e.g., respective sides of IC die 64C abut second lateral contact surfaces 89A and 89B). The entire process with respect to FIGS. 4-7 may then be continued until stacked IC system 60 contains the desired number of IC tiers 86.

While FIGS. 4-7 illustrate stacked IC system 60 being assembled on a tier-by-tier basis, system 60 may be formed using any applicable technique. For example, in some examples, stacked IC system 60 may be assembled by first forming contour support 72 including plurality of support frames 87 and plurality of support plates 84. As described above, in some examples, support frames 87 and support plates 84 may be integrally formed as a unitary structure. In this manner, adjacent support plates 84 may define gaps for receiving the corresponding IC dies 62, 64, 66, and 68. The IC dies 62, 64, 66, and 68 may then be inserted into the gaps and attached to corresponding support plates 84 using any applicable technique including, for example, backfilling of an adhesive, melting of an adhesive preform, ultraviolet (UV) curing of an adhesive, or the like.

Figure 8:
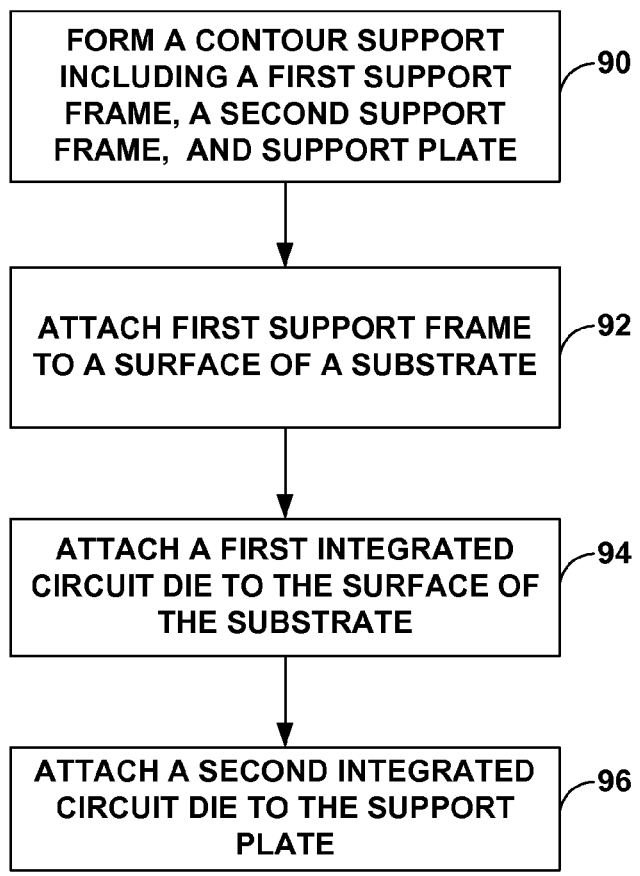
FIG. 8 is a flow diagram illustrating an example technique for forming an example stacked IC system in accordance with the disclosure.

FIG. 8 is a flow diagram illustrating an example technique that may be used to form a stacked IC system of the disclosure, such as, for example, stacked IC system 60 of FIGS. 3A and 3B. While the technique shown in FIG. 8 is described with respect to stacked IC system 60, in other examples, the technique may be used to form other stacked IC systems that include different configurations.

The technique illustrated in FIG. 8 includes forming a contour support 72 including a first support frame 87A, a support plate 84A, and a second support frame 87B (90). Support plate 84A may include a lower support plate major surface 83 (FIG. 6B), and first support frame 87A may be attached to lower support plate major surface 83. First support frame 74A may include at least one lateral contact surface, e.g., 88A, aligned substantially orthogonal (e.g., orthogonal or nearly orthogonal) to lower support plate major surface 83. Second support frame 87B may be attached to the opposite side of support plate 84A from first support frame 87A (e.g., second support frame 87B attaches to first support plate major surface 85A). Second support frame 87B may include at least one second lateral contact surface, e.g., 89A, aligned substantially orthogonal to lower support plate major surface 83. As discussed above, in some examples, contour support 72 may be formed in unison with the assembly of IC dies 62, 64, 66, and 68 on a tier-by-tier basis. In other examples, contour support 72 may be formed as a unitary structure prior to incorporating IC dies 62, 64, 66, and 68 in stacked IC system 60.

The technique of FIG. 8 also may include attaching first support frame 87A to substrate major surface 71 (92). In some examples, first support frame 87A may be attached to substrate major surface 71 using an adhesive, solder, or another joining technique.

The technique of FIG. 8 further may include attaching at least a first IC die (e.g., one or more of IC dies 62) to substrate major surface 71 (94). In some examples, as described above with respect to FIGS. 4-7, the at least a first IC die may be attached to substrate major surface 71 before support plate 84A is attached to first support frame 87A and the at least a first IC die. In other examples, support plate 84A may be integral with first support frame 87A or attached to first support frame 87A before the at least a first IC die is attached to substrate major surface 71, such that the at least a first IC die is inserted between substrate major surface 71 and support plate 84A. At least one side of the at least a first IC die may abut a respective lateral contact surface of first support frame 87A, such that first support frame 87A affects the lateral positioning of the at least a first IC die. The at least a first IC die may be attached to substrate major surface 71, support plate 84A, or both using, for example, an adhesive.

The technique of FIG. 8 further may include attaching at least a second IC die (e.g., one or more of IC dies 64) to support plate 84A (94). The at least a second IC die may be attached to a side of support plate 84A opposite of the at least a first IC die. At least one side (e.g., perimeter side) of the at least a second IC die may abut a respective lateral contact surface of second lateral contact surfaces 89 of second support frame 87B, such that second support frame 87B affects the lateral positioning of the at least a second IC die, and at least one side of the at least a second IC die is laterally offset from at least one side of the at least a first IC die. The at least a second IC die may be attached to support plate 84A using, for example, an adhesive.

Various examples have been described. These and other examples are within the scope of the following claims.

What is claimed is:

1. A stacked integrated circuit system comprising:
   a substrate defining a substrate major surface;
   a contour support comprising:
      a first support frame attached to the substrate major surface and defining a first lateral contact surface substantially orthogonal to the substrate major surface;
      a support plate comprising a support plate major surface that is substantially parallel to the substrate major surface, wherein the support plate is on the first support frame, and wherein the support plate comprises at least one of aluminum, anodized aluminum, alumina, aluminum nitride, beryllium oxide, brass, stainless steel, perforated circuit board material, silicon carbide, nickel/iron or alloys of nickel/iron alloy, nickel/iron/molybdenum or alloys of nickel/iron/molybdenum, nickel alloy, iron alloy, or cobalt alloy; and
      a second support frame defining a second lateral contact surface substantially orthogonal to the substrate major surface, wherein the second support frame is on the support plate such that the support plate is between the first and second support frames, and wherein the second lateral contact surface is set back from the first lateral contact surface measured in a lateral direction substantially parallel to the substrate major surface;
   a first integrated circuit die comprising a first integrated circuit die major surface, wherein the first integrated circuit die major surface is substantially parallel to the substrate major surface and a first side of the first integrated circuit die abuts the first lateral contact surface, such that at least a portion of the first integrated circuit die is between the support plate and the substrate major surface; and
   a second integrated circuit die comprising a second integrated circuit die major surface, wherein the second integrated circuit die major surface is substantially parallel to the substrate major surface and a first side of the second integrated circuit die abuts the second lateral contact surface, such that at least a portion of the first integrated circuit die and at least a portion of the support plate are between the second integrated circuit die and the substrate major surface,
   wherein the contour support defines a mounting aperture that extends through the contour support in a direction substantially orthogonal to the substrate major surface.

2. The stacked integrated circuit system of claim 1, wherein the first support frame defines a third lateral contact surface such that the first and third lateral contact surfaces are oriented in different directions, wherein the second support frame defines a fourth lateral contact surface such that the second and fourth lateral contact surfaces are oriented in different directions, wherein the fourth lateral contact surface is set back from the third lateral contact surface measured in a lateral direction substantially parallel to the substrate major surface, wherein a second side of the first integrated circuit die abuts the third lateral contact surface and a second side of the second integrated circuit die abuts the fourth lateral contact surface such that the first and second integrated circuit dies are laterally offset from one another in at least two directions.

3. The stacked integrated circuit system of claim 1, wherein:
   the substrate comprises a plurality of substrate bond pads on the substrate major surface;
   the first integrated circuit die comprises a first plurality of integrated circuit bond pads along the first integrated circuit die major surface, wherein the support plate does not cover at least one integrated circuit bond pad of the first plurality of integrated circuit bond pads, and wherein the at least one integrated circuit bond pad is electrically connected to at least one substrate bond pad of the plurality of the substrate bond pads; and
   the second integrated circuit die comprises a second plurality of integrated circuit bond pads along the second integrated circuit die major surface, wherein at least one integrated circuit bond pad of the second plurality of integrated circuit bond pads is electrically connected to at least one substrate bond pad of the plurality of the substrate bond pads.

4. The stacked integrated circuit system of claim 1, wherein the support plate comprises at least one electrically conductive trace that is electrically connected to the first integrated circuit die.

5. The stacked integrated circuit system of claim 1, wherein the support plate comprises a thermally conductive material.

6. The stacked integrated circuit system of claim 1, wherein the first support frame, the second support frame, and the support plate are a unitary structure.

7. A stacked integrated circuit system comprising:
   a substrate defining a substrate major surface;
   a contour support comprising:
      a first support frame attached to the substrate major surface and defining a plurality of first lateral contact surfaces substantially orthogonal to the substrate major surface;

a second support frame defining a plurality of second lateral contact surfaces substantially orthogonal to the substrate major surface, wherein the second support frame is on the first support frame, wherein the second support frame is farther from the substrate major surface than the first support frame;

a first plurality of integrated circuit dies attached to the substrate major surface, wherein the first plurality of integrated circuit dies are all within a first plane, wherein each respective integrated circuit die of the first plurality of integrated circuit dies defines a first die major surface substantially parallel to the substrate major surface and has at least one side that abuts at least one lateral contact surface of the plurality of first lateral contact surfaces; and a second plurality of integrated circuit dies, wherein the second plurality of integrated circuit dies are all within a second plane, wherein each respective integrated circuit die of the second plurality of integrated circuit dies defines a second die major surface substantially parallel to the substrate major surface and has at least one side that abuts at least one lateral contact surface of the plurality of second lateral contact surfaces, and wherein, for each integrated circuit die of the first plurality of integrated circuit dies, at least a portion of the integrated circuit die lies between the substrate major surface and an integrated circuit die of the second plurality of integrated circuit dies.

8. The stacked integrated circuit system of claim 7, wherein the contour support comprises a thermally conductive material.

9. The stacked integrated circuit system of claim 7, wherein each of the first plurality of integrated circuit dies abuts at least two lateral contact surfaces of the plurality of first lateral contact surfaces, and wherein each of the second plurality of integrated circuit dies abuts at least two lateral contact surfaces of the plurality of second lateral contact surfaces.

10. The stacked integrated circuit system of claim 7, wherein the contour support defines a mounting aperture that extends through the contour support in a direction substantially orthogonal to the substrate major surface.

11. The stacked integrated circuit system of claim 7, wherein:
the substrate comprises a plurality of substrate bond pads on the substrate major surface;
at least one of the first plurality of integrated circuit dies comprises a plurality of first integrated circuit bond pads along the first die major surface, wherein none of the second plurality of integrated circuit dies covers at least one integrated circuit bond pad of the first plurality of integrated circuit bond pads, and wherein the at least one integrated circuit bond pad is electrically connected to at least one substrate bond pad of the plurality of the substrate bond pads; and
at least one of the second plurality of integrated circuit dies comprises a plurality of second integrated circuit bond pads along the second die major surface, wherein at least one integrated circuit bond pad of the plurality of second die pads is electrically connected to at least one substrate bond pad of the plurality of the substrate bond pads.

12. The stacked integrated circuit system of claim 7, wherein the first plurality of integrated circuit dies comprises at least four integrated circuit dies, and the second plurality of integrated circuit dies comprises at least four integrated circuit dies.

13. The stacked integrated circuit system of claim 12, wherein the first support frame is located in a middle of the first plurality of integrated circuit dies, and wherein the second support frame is located in a middle of the second plurality of integrated circuit dies.

14. The stacked integrated circuit system of claim 7, wherein the contour support further comprises a support plate defining a support plate major surface that is substantially parallel to the substrate major surface, wherein a portion of the support plate is between the first support frame and the second support frame, wherein at least a portion of each integrated circuit die of the first plurality of integrated circuit dies lies between the support plate and the substrate major surface, and wherein a portion of the support plate lies between the second plurality of integrated circuit dies and the first plurality of integrated circuit dies, wherein the support plate comprises at least one of aluminum, anodized aluminum, alumina, aluminum nitride, beryllium oxide, brass, stainless steel, perforated circuit board material, silicon carbide, nickel/iron or alloys of nickel/iron alloy, nickel/iron/molybdenum or alloys of nickel/iron/molybdenum, nickel alloy, iron alloy, or cobalt alloy.

15. The stacked integrated circuit system of claim 14, wherein the support plate comprises at least one electrically conductive trace that electrically connects at least two integrated circuit dies of the first plurality of integrated circuit dies.

16. The stacked integrated circuit system of claim 14, wherein the support plate comprises at least one electrically conductive trace that is electrically connects at least one integrated circuit die of the first plurality of integrated circuit dies to at least one integrated circuit die of the second plurality of integrated circuit dies.

17. A method comprising:
forming a contour support comprising:
a first support frame having a first lateral contact surface;
a support plate having a support plate major surface, wherein the first support frame is attached to the support plate major surface with the first lateral contact surface substantially orthogonal to the support plate major surface, and wherein the support plate comprises at least one of aluminum, anodized aluminum, alumina, aluminum nitride, beryllium oxide, brass, stainless steel, perforated circuit board material, silicon carbide, nickel/iron or alloys of nickel/iron alloy, nickel/iron/molybdenum or alloys of nickel/iron/molybdenum, nickel alloy, iron alloy, or cobalt alloy;
a second support frame having a second lateral contact surface; wherein second support frame is attached to the support plate on a side opposite to the support plate major surface with the second lateral contact surface substantially orthogonal to the support plate major surface, and wherein the second lateral contact surface is set back from the first lateral contact surface measured in a lateral direction substantially parallel to the support plate major surface; and
establishing a mounting aperture that extends through the contour support;
attaching the first support frame to a major surface of a substrate;
attaching a first integrated circuit die to the major surface of the substrate such that a side of the first integrated circuit die abuts the first lateral contact surface; and
attaching a second integrated circuit die to the support plate, wherein a side of the second integrated circuit die abuts the second lateral contact surface, and wherein a portion of the support plate is between at least a portion of the first integrated circuit die and at least a portion of second integrated circuit die.

18. The method of claim 17, further comprising:
forming an electrical trace in the support plate; and
electrically connecting the first integrated circuit die to at least one other integrated circuit die of the plurality of integrated circuit dies via the electrical trace.

19. The method of claim 17,
wherein the first support frame defines a first plurality of lateral contact surfaces substantially orthogonal to the major surface of the substrate, the first plurality of lateral contact surfaces including the first lateral contact surface;
wherein the second support frame defines a second plurality of lateral contact surfaces substantially orthogonal to the major surface of the substrate, the second plurality of lateral contact surfaces including the second lateral contact surface; the method further comprising:
attaching a first plurality of integrated circuit dies to the major surface of the substrate such that each integrated circuit die of the first plurality of integrated circuit dies has at least one side that abuts a respective surface of the first plurality of lateral contact surfaces, wherein the first plurality of integrated circuit dies includes the first integrated circuit die; and
attaching a second plurality of integrated circuit dies to the support plate such that each integrated circuit die of the second plurality of integrated circuit dies has at least one side that abuts a respective surface of the second plurality of lateral contact surfaces, wherein the second plurality of integrated circuit dies includes the second integrated circuit die.

* * * * *